United States Patent [19]

Cho et al.

[11] 4,271,255
[45] Jun. 2, 1981

[54] METHOD FOR THE PREPARATION OF PLANOGRAPHIC PRINTING PLATES

[75] Inventors: Kenji Cho, Tokyo; Minoru Takamizawa; Yoshio Inoue, both of Annaka, all of Japan

[73] Assignees: Dai Nippon Printing Co. Ltd.; Shin-Etsu Chemical Co. Ltd., both of Tokyo, Japan

[21] Appl. No.: 134,435

[22] Filed: Mar. 27, 1980

[30] Foreign Application Priority Data

Apr. 5, 1979 [JP] Japan .................................. 54-41416

[51] Int. Cl.³ .......................... G03C 11/12; G03F 7/02
[52] U.S. Cl. .................................... 430/253; 430/258; 430/302; 430/303; 430/502
[58] Field of Search ............... 430/253, 258, 302, 303, 430/502

[56] References Cited

U.S. PATENT DOCUMENTS

| 4,050,936 | 9/1977 | Takeda et al. ................. 430/253 |
| 4,169,731 | 10/1979 | Noshiro et al. ............... 430/303 X |
| 4,175,964 | 11/1979 | Uchida et al. ................ 430/253 |
| 4,184,873 | 1/1980 | Noshiro et al. ............... 430/303 X |
| 4,191,572 | 3/1980 | Cohen et al. ................. 430/300 X |

*Primary Examiner*—Edward C. Kimlin
*Attorney, Agent, or Firm*—Toren, McGeady and Stanger

[57] ABSTRACT

The invention provides a novel method for the preparation of a printing plate suitable for dry planographic printing without supply of dampening water utilizing the ink-repellency of a cured silicone resin. In the inventive method, a base plate provided with two successive layers of a first adhesive agent and a photocurable organopolysiloxane composition is overlaid with a UV-transparent covering sheet provided with a layer of a second adhesive agent in such a manner that the layers of the organopolysiloxane composition and the second adhesive agent are in direct contact with each other and irradiated with UV light pattern-wise through the sheet. The adhesive bonding strength between the second adhesive agent and the organopolysiloxane composition exhibited by the exposure to light is larger than between the first adhesive agent and the organopolysiloxane composition so that peeling of the covering sheet off the base plate leaves the layer of the organopolysiloxane composition pattern-wise in the unirradiated areas, which is subsequently photocured by the second exposure to light to give image-wise ink-repellent areas formed of the cured organopolysiloxane composition bonded to the base plate useful as a planographic printing plate of high durability.

4 Claims, 6 Drawing Figures

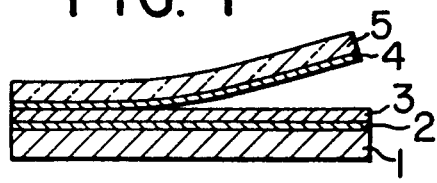
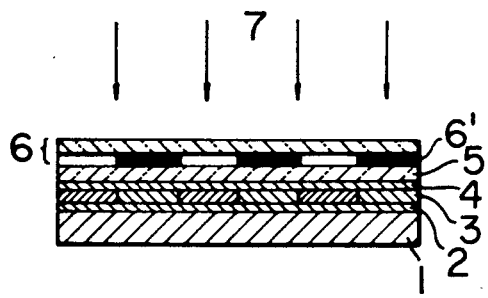
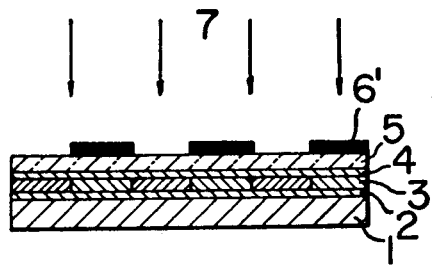
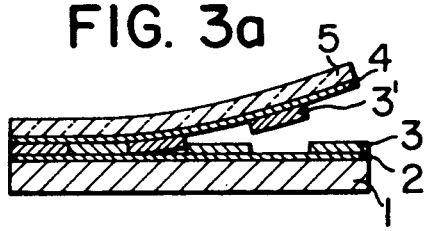
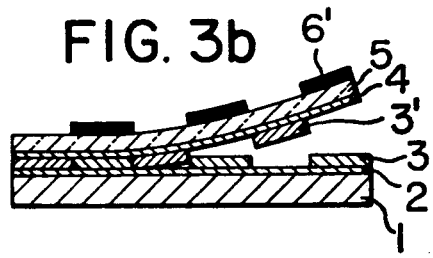
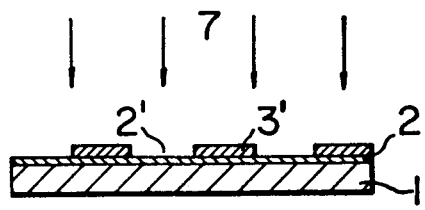

METHOD FOR THE PREPARATION OF PLANOGRAPHIC PRINTING PLATES

BACKGROUND OF THE INVENTION

The present invention relates to a method for the preparation of a planographic printing plate or, more particularly, to a method for the preparation of a printing plate suitable for dry planographic printing without the use of dampening water in a simple and convenient plate-making process free from the problems in the prior art.

Hitherto, there have been proposed methods for the preparation of printing plate for dry planographic printing utilizing various principles. Nevertheless, none of them is quite satisfactory from the practical standpoint due to their respective drawbacks such as inferior performance as a printing plate or due to the excessively complicated plate-making process.

For example, there are known processes utilizing a diazo type photosensitive composition. Japanese Patent Publication No. 44-23042 teaches a process in which a master plate is prepared by providing two successive layers of a diazo photosensitive layer and a layer of a dimethylpolysiloxane gum on a base plate such as an aluminum plate and the matter plate is exposed to light through a positive transparency overlaid in contact therewith to insolubilize the diazo photosensitive composition in the irradiated areas followed by removal of the diazo composition in the unirradiated areas by dissolving away in a development process and peeling of the layer of the dimethylpolysiloxane gum in the unirradiated areas off the plate.

Further, Japanese Patent Publication No. 46-16044 discloses a process in which a master plate is prepared by providing three successive layers of a diazo photosensitive layer, a layer of an adhesive agent and a layer of a silicone gum on a base plate such as an aluminum plate and the master plate is exposed to light through a negative transparency overlaid in contact therewith followed by development treatment utilizing the photode-composition of the photosensitive diazo composition in the irradiated areas and peeling of the layer of the silicone gum in the irradiated areas off the plate to give a planographic printing plate.

Both of the above described diazo processes have several serious problems. Firstly, the pattern-wise exposure to light for reproducing the images on the positive or negative transparency cannot have a satisfactory accuracy or fidelity because of the presence of the intervening layer of the non-photosensitive silicone gum between the photosensitive diazo layer and the transparency bearing the images. Secondly, the image patterns formed by the layer of the silicone gum after peeling cannot be so sharp and clear-cut in the edge lines because peeling of the layer of the silicone gum is carried out by utilizing the changes of solubility of the photosensitive layer in a solvent. In addition, these processes are disadvantageous due to the complicated steps in plate-making including preparation of the master plate having two or three successive layers on a base plate, exposure to light and development.

Some of the inventors have previously proposed a process in which the image patterns on a printing plate are formed by dissolving away the uncured photosensitive silicone resin on the unirradiated areas by the exposure to light and development on a master plate prepared using a photosensitive silicone resin (see Japanese Patent Disclosure No. 48-33910).

This process is, however, also defective because the problem of the complicated plate-making steps is not solved including the removal of the silicone layer on the image areas by a wet process of development following the exposure to light to give a desired planographic printing plate.

In contrast to the above described known processes for plate-making in which a step of treatment in wet is included, there are known several plate-making processes carried out in dry and most of such dry processes utilize a principle according to which the image patterns are formed with a tonor powder on the surface of a cured silicone layer provided on a base plate by utilizing the techniques of electrostatic photography.

One of the defects in the printing plates prepared by such a tonor process is the poor durability of the printing plate in the printing process due to the low adhesive bonding strength between the tonor and the surface of the cured silicone layer along with the less satisfactory printability of the plates.

For example, Japanese Patent Disclosure No. 48-19305 discloses a plate-making process for dry planography according to which a master plate is prepared by providing a substrate with successive layers of a substance for electrostatic latent image formation and a curable silicone resin with subsequent curing of the latter and tonor images are formed theron electrophotographically and bonded to the surface of the plate by thermal fusion to give a desired printing plate for dry planographic printing. A defect of the thus prepared printing plates is the poor durability of the plate in printing due to the incomplete adhesive bonding of the tonor to the surface of the plate since the silicon resin forming the surface layer has been cured prior to image formation.

Accordingly, various means have been proposed to improve the adhesive bonding of the tonor material and the surface of the silicone layer though with their respective drawbacks. For example, Japanese Patent Disclosure No. 49-21204 discloses a method in which a planographic printing plate is prepared by transferring and bonding by thermal fusion the tonor images formed on the electrophotographically photosensitive layer on to a layer formed of a mixture of a silicone gum and a resin. The planographic printing plate obtained in this manner is defective in its rather poor ink repellency since the surface layer is formed by admixing a resinous component with an object to improve the adhesive bonding between the tonor and the surface of the silicone layer.

Further, Japanese Patent Disclosure Nos. 50-71405, 50-78403 and others disclose a method for the preparation of a planographic printing plate by utilizing an uncured or semi-cured silicone on the substrate, which is subsequently cured after electrophotographic transfer and thermal fixing of tonor images. The planographic printing plates of this type are disadvantageous due to their low storability with the silicone layer as uncured or semi-cured because the thermosetting silicone resin used in the silicone layer is gradually crosslinked even without heating leading to the loss of the adhesivity to the tonor material in the lapse of time.

Therefore, a somewhat troublesome means is undertaken in some of the planographic printing plates by the above principle that curing of the silicone layer is effected by applying a solution of a thermal curing catalyst only after the transfer of the tonor images by the electrophotographic technique.

Furthermore, Japanese Patent Disclosure No. 51-16105 teaches a method for the preparation of a master plate for printing and a printing plate in which a coating layer is formed on a substrate of a silicone gum composition containing two kinds of catalysts and one of the catalysts is activated by exposure to light while the other is activated thermally to cure the silicone gum. This method is, however, defective because, in addition to the troublesome formulation of the photo-activated catalyst such as a reactive azide compound and the thermally activated catalyst such as an organic peroxide, a silicone gum composition containing suh a combination of the catalysts cannot be stored with stability for a long period of time and the heating step is also indispensable when sufficient cure of the silicone gum is desired.

A further improved method is described in Japanese Patent Disclosure 51-134204 for the preparation of a plate material for printing plates suitable for peeling development. The plate material utilizes a layer of a photocurable silicone gum composed of a silicone gum and a photopolymerizing ingredient or a crosslinkable monomer or oligomer sandwiched between two substrates each having a first or a second treated layer with specific properties facing the layer of the photocurable silicone gum and the image-wise exposure of the plate material to light produces a difference between the adhesive bonding strengths of the layer of the silicone gum to the first and the second treated layers. The photocurable silicone gum composition sandwiched between the substrates has a property that the adhesive bonding strength thereof to the first treated layer is decreased by exposure to light to give increased peelability in the irradiated areas. When a printing plate of negative images relative to the original is desired in this method, a second exposure to light of the uncured silicone gum layer is necessary which unavoidably results in a marked decrease in the bonding strength between the cured silicone gum layer and the first treated layer so that the usefulness of this method is limited by a relatively low durability of the printing plate in the printing run. A similar method described in Xerox Disclosure Journal, volume 1, No. 2, 1976, page 15 by R.G. Crystal is also not free from the problem of the decreased adhesive bonding strength caused by the second exposure to light between the cured silicone gum layer and the base plate.

Some of the inventors conducted extensive investigations in view of the above described problems to provide a simple and convenient method for the preparation of a printing plate suitable for dry planographic printing and have proposed a method according to which a printing plate for dry offset printing is obtained.

According to the method described in U.S. Pat. Nos. 4,169,731 and No. 4,184,873, a planographic printing plate is prepared by the steps of (a) coating one surface of substrate which is transparent to ultraviolet light with an uncured photocurable silicone, (b) bringing the thus coated surface into direct contact with a surface of a base plate to form a laminate, (c) providing on the other surface of the substrate an image pattern made of a material which is opaque to ultraviolet light, (d) irradiating the laminate with ultraviolet light from above the image pattern and (e) separating the substrate from the base plate to allow a portion of the photocured silicone coating to transfer to the surface of the base plate, and a portion of the uncured silicone coating to stay in situ on the surface of the substrate. The image pattern made of a material which is opaque to ultraviolet light used in the step (c) above is positive relative to the printed images. This method is not free from a problem in the poor bonding on to the base plate by dry laminating since the cured silicone layer finally left on the base plate is formed by dry lamination in an uncured state followed by photocuring.

On the other hand, there has been a demand for image patterns formed on a base plate with a similarly cured silicone material by use of a negative transparency relative to the printed images in order to obtain versatility in the originals for printing which may be positive or negative. The inventors have conducted extensive investigations to comply with this demand and proposed a method (see Japanese Patent Disclosure No. 54-121804). The method comprises the steps of (a) bringing a UV-transparent sheet into direct contact with a layer of a photocurable silicone provided on a base plate, irradiating the photocurable silicone through an image pattern opaque to ultraviolet light provided on the sheet, (c) peeling the sheet together with the silicone photocured image-wise to leave uncured silicone on the base plate and (d) subjecting the uncured silicone on the base plate to photocuring by irradiating with ultraviolet light so as that the resultant plate has image areas where the surface of the base plate is exposed bare and non-image areas where the base plate is covered with the photocured silicone.

The planographic printing plate prepared as described above suffers from a problem of insufficient adhesive bonding of the photocured silicone to the base plate because the adhesive performance of the silicone is so designed that the silicone transfers from the surface of the base plate to the bottom surface of the peeling sheet when the silicone is photocured by pattern-wise exposure to light.

SUMMARY OF THE INVENTION

It is therefore an oject of the present invention to provide a novel and improved method for the preparation of a printing plate suitable for dry planographic printing without the use of dampening water, the method being simple and convenient to practise and free from the above described problems in the prior art dry planographic printing plates.

The present invention established as a result of the extensive investigations undertaken by the inventors in view of the above described problems in the prior art is based on the discovery that satisfactory results are obtained when a base plate is provided with a layer of a first adhesive agent which exhibits adhesion of relatively low strength on exposure to light or has a relatively low or desensitized photosensitivity while a peeling sheet is provided with a layer of a second adhesive agent exhibiting larger increment of the adhesive strength than the first adhesive agent when exposed to the same dose of light with a relatively high or sensitized photosensitivity.

Thus, the method of the present invention for the preparation of a dry planographic printing plate comprises the steps of (a) laminating a base plate provided on one surface thereof with successive layers of a first adhesive agent and a photocurable organopolysiloxane composition, the adhesive bonding strength of the first adhesive agent to the organopolysiloxane composition being increased with the exposure dose to light, and a sheet which is transparent to ultraviolet light and provided on one surface thereof with a layer of a second adhesive agent so as that the layer of the photocurable organopolysiloxane composition and the layer of the second adhesive agent are in direct contact with each other, the adhesive bonding strength of the second adhesive agent to the photocurable organopolysiloxane composition being increased with the exposure dose to light and the second adhesive agent being imparted with a stronger adhesive bonding strength to the photocurable organopolysiloxane composition than the first adhesive agent with the exposure dose to light being the same.

(b) subjecting the laminate obtained in step (a) above to imagewise exposure to light through an image opaque to ultraviolet light provided on said sheet, (c) separating said sheet apart from said base plate by peeling so as that the layer of the organopolysiloxane composition photocured in the areas exposed to light is carried by the sheet and the layer of the uncured organopolysiloxane composition in the unexposed areas is left on the base plate, and (d) subjecting the base plate bearing the layer of the uncured organopolysiloxane composition to exposure to light to effect photocuring of the organopolysiloxane composition.

The above described method of the invention is very advantageous in that the process is performed throughout in dry without the use of any solutions to give a dry planographic printing plate having a printing surface composed of the ink-repellent non-image areas formed of the layer of the photocured organopolysiloxane composition bonded to the base plate through the layer of the first adhesive agent and the ink-receptive image areas formed of the bare surface of the layer of the first adhesive agent on the base plate.

BRIEF DESCRIPTION OF THE DRAWING

FIG. 1 to FIG. 4 illustrate the above described successive steps (a) to (d) of the inventive method by the cross section of the base plate and the sheet.

DETAILED DESCRIPTION OF THE PREFERRED EMBODIMENTS

As is understood from the above given description, the method of the invention utilizes the principle that the pattern-wise photocuring of the photocurable organopolysiloxane composition is accompanied by the simultaneous transfer of the photocured organopolysiloxane layer from the base plate to the sheet and curing of the uncured organopolysiloxane composition left pattern-wise on the base plate is effected by exposure to light in a dose as large as desired with simultaneous increase of the adhesive bonding strength thereof to the base plate so as that the resultant printing plate is imparted with an unusually high durability in printing.

In the hitherto known positive type plate materials for peeling development, i.e. plate materials for pattern-wise exposure to light through a positive transparency, the silicone layer photocured by the pattern-wise exposure to light is firmly bonded to the adhesive layer on the base plate to form the non-image areas of the printing plate. This effect is obtained by the increase in the adhesive bonding strength between the cured silicone layer and the adhesive layer on the base plate with the exposure dose so that the bonding strength between the cured silicone layer and the adhesive layer is sufficiently high after completion of plate making to endure an ordinary planographic printing process. On the other hand, in negative type plate materials, i.e. plate materials for pattern-wise exposure to light through a negative transparency, for peeling development using a photocurable silicone, such as disclosed in Japanese Patent Disclosure No. 54-121804, the layer of the photocurable silicone must be so designed that it transfers by the pattern-wise exposure to light to the surface of the peeling sheet and adhesively bonded thereto as a layer of cured silicone. In addition, the layer of the uncured silicone left on the base plate must be subsequently photocured to form the non-image areas with increased ink-repellency and, desirably, with increased adhesive bonding strength with the surface of the adhesive layer on the base plate by this second exposure to light.

Thus, the adhesive layer on the base plate must satisfy the following requirements that (a) the photocured silicone layer by pattern-wise exposure is bonded more firmly to the adhesive layer on the peeling sheet than to the adhesive layer on the base plate while (b) strong adhesive bonding is obtained by the second exposure to light according to the exposure dose between the cured silicone layer and the adhesive layer on the base plate.

The method of the present invention has been established as a result of the extensive study in consideration of the above requirements and, according to the invention, the base plate is provided with a layer of the first adhesive agent as described above having a relatively low or reduced photosensitivity and the peeling sheet is provided with a layer of the second adhesive agent having a larger photosensitivity inherently or as sensitized which is imparted with a larger adhesive bonding strength to the photocured silicone layer than the first adhesive agent with the exposure dose to light being the same.

In the following, the method of the invention is described in detail with reference to the drawing annexed to illustrate the successive steps of the inventive method.

A finished planographic printing plate prepared by the inventive method is shown by the schematic cross section in FIG. 4. The dry planographic printing plate in FIG. 4 is composed of the base plate 1 provided with a layer 2 of the first adhesive agent which in turn bears the pattern-wise layer 3' of the photocured organopolysiloxane composition to form the ink-repellent non-image areas leaving the bare surface 2' of the layer of the first adhesive agent to form the ink-receptive image areas.

The process of plate making is now described in the sequential order of the steps. As is shown in FIG. 1, the base plate 1 is provided with two successive layers of the first adhesive agent 2 and a photocurable oragnopolysiloxane composition 3. The first adhesive agent is also photosensitive and the adhesive bonding strength thereof with the layer of the photocurable organopolysiloxane composition increases with the exposure dose to light. A sheet 5 having transparency to ultraviolet light provide with a layer of the second adhesive agent 4 is then overlaid on the base plate 1 so as that the layer 4 of the second adhesive agent comes to direct contact with the layer 3 of the photocurable organopolysiloxane composition. The second adhesive agent 4 is also photosensitive and the adhesive bonding strength thereof with the layer 3 of the photocurable oragnopolysiloxane composition increases with the exposure dose to light while it is essential in this case that the adhesive bonding strength between the layer of the second adhesive agent 4 and the layer of the photocurable organopolysiloxane composition 3 is larger than that between the layer of the first adhesive agent 2 and layer of the photocurable organopolysiloxane composition 3 when the layers 2 and 4 of the first and the second adhesive agents have received the same dose of irradiation with light.

It should be noted in overlaying the sheet 5 on to the base plate 1 that care must be taken to exclude any bubbles remaining between the layers 3 and 4 of the photocurable organopolysiloxane composition and the second adhesive agent by applying a sufficient pressure or by squeezing out the bubbles.

The materials of the base plate 1 may be conventional and not particularly limitative. For example, plates of metals such as copper, aluminum, stainless steel, zinc, iron and the like and plates of various kinds of synthetic resins such as saturated polyesters, cellulose triacetate, cellulose diacetate, polyvinyl chloride, polyvinylidene chloride, polystyrene, acrylic resins, polycarbonate resins and the like are suitable as well as various laminated plates of paper and a metal foil or plastic film. Thickness of the base plate 1 is also not limitative. It is recommended that the surface of the base plate 1 is thoroughly cleaned before coating with the first adhesive agent 2.

On the other hand, the material of the sheet 5 having transparency to ultravoilet light is also not limitative provided that sufficient transmission of the ultraviolet light is obtained including films of plastics such as saturated polyesters, cellulose triacetate, cellulose diacetate, polyvinyl chloride, polyvinylidene chloride, polystyrene, acrylic resins, polyolefin resins polycarbonate resins and the like. The thickness of the sheet 5 may be as small as desired in so far as the dimensional stability can be ensured and no inconvenience is encountered in handling it.

The base ingredient in the adhesive agent used for the first adhesive layer 2 on the base plate 1 or for the second adhesive layer 4 on the sheet 5 may be a conventional photocurable resin and the first and the second adhesive agents may contain one and the same photocurable resin as the base ingredient. Suitable photocurable resins include those composite photosensitive resins composed of a photopolymerizable or photocrosslinkable ingredient having acryloyl groups as the photosensitive group, such as acrylamide, acrylic acid, acrylic esters, acrylonitrile and the like and a binder ingredient for the photopolymerizable or photocrosslinkable ingredient, such as nylons, polyamide resins, chlorinated polyolefins and the like, photopolymerizable resins having cinnamoyl groups as the photosensitive groups, such as vinyl cinnamate, cinnamylidene acetate and the like, and courmarine resins.

When the above described photosensitive base ingredient is used for formulating the first and the second adhesive agents, it is necessary that the photosensitivity of the adhesive agents is appropriately adjusted by adding certain additive agents in order to meet the above described requirement for the relationship between the adhesive bonding strengths of the first and the second adhesive agents with the photocurable organopolysiloxane composition by exposure to light.

For example, the first adhesive agent to be applied to the base plate 1 is formulated with the photosensitive base ingredient by admixing an ultraviolet absorber, free-radical scavenger, thermal polymerization inhibitor or reducing agent as a photoreaction retarder or desensitizing agent, such as dimethyl 4-methoxybenzylidenemalonate, 4-benzoyloxy-2,2,6,6-tetramethyl piperidine, 2-(3',5'-diethyl-2'-hydroxyphenyl) benzotriazole, hydroquinone, 4-methoxyphenol, 2,2'-methylene-bis-(4-ethyl-6-tertbutylphenol),novolac-type phenol resins, tert-butylcatechol, tert-butylpyrogallol and the like. The amount of the photodesensitizing agents in the first adhesive agent naturally depends on the kind of the compound and the desired photosensitivity in consideration of the balance with the photosensitivity of the second adhesive agent on the sheet but it is usually in the range from 1.0 to 40% by weight based on the photosensitive base ingredient.

On the other hand, the second adhesive agent to be applied on to the sheet 5 is preferably formulated with the photosensitive base ingredient sensitized by adding a suitable photosensitizer such as benzophenone, benzoin alkyl ethers, 2-methylanthraquinone, 4,4'-bis(dimethylamino)benzophenone, 1,2-benzanthraquinone and the like in order to ensure sufficient difference in the adhesive bonding strengths between the first and the second adhesive agents. The amount of the photosensitizer is usually from 0.5 to 6.0% by weight.

The method for applying the first and the second adhesive agents on to the base plate 1 or the sheet 5 to form the adhesive layers 2 or 4, respectively, is conventional including whirler coating, brush coating, spray coating, rod coating, roller coating and the like. The thickness of each of the adhesive layers 2 and 4 is preferably in the range from about 0.2 to about 10 μm.

Examples of the photocurable organopolysiloxane to form the layer 3 of the photocurable organopolysiloxane composition over the first adhesive layer 2 on the base plate 1 are as follows.

(1) Japanese Patent Disclosures Nos. 51-125277 and 52-13907 teach a photocurable organopolysiloxane containing organosiloxane units to which one or more of substituted maleimide groups are bonded. Such a maleimide-containing organopolysiloxane is represented by the following average unit formula (I)

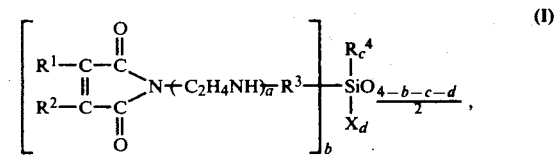

in which $R^1$ is a monovalent hydrocarbon group or a monovalent heterocyclic group, $R^2$ is a hydrogen atom, halogen atom, cyano group or an alkyl group having from 1 to 4 carbon atoms, $R^3$ is a divalent hydrocarbon group having from 1 to 10 carbon atoms, $R^4$ is a monovalent hydrocarbon group, X is a hydroxy group or a hydrolyzable atom or group, a is a number of zero or 1, b is a positive number not exceeding 1 and c and d are each zero or a positive number not exceeding 3 with the proviso that $b+c+d$ is a positive number not exceeding 4.

In particular, Japanese Patent Disclosure No. 52-13907 discloses a maleimide-containing photocurable organopolysiloxane within the general definition of the above given average unit formula (I) but expressed by the following general formula (II)

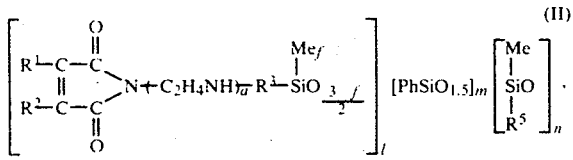

(II)

in which Me is a methyl group, Ph is a phenyl group, $R^1$, $R^2$ and $R^3$ each have the same meaning as defined above, $R^5$ is a methyl group or a trifluoropropyl group, a and f are each zero or 1 and l, m and n are each a positive integer with the proviso that n is 25 or larger, n/l is in the range from 25 to 2000 and n/m is in the range from 2.5 to 50.

(2) Japanese Patent Disclosures Nos. 48-19682 and 52-113805 teach a photocurable organopolysiloxane containing organosiloxane units to which one or more of acryloxy groups or substituted acryloxy groups are bonded. Such an acryloxy-containing organopolysiloxane is represented by the following average unit formula (III)

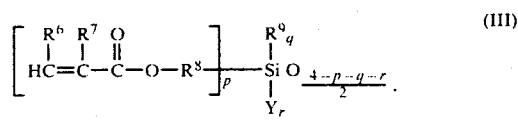

(III)

in which $R^6$ is a hydrogen atom, a phenyl group or a halogenated phenyl group, $R^7$ is a hydrogen atom or a methyl group, $R^8$ is a divalent hydrocarbon group having from 1 to 10 carbon atoms, $R^9$ is a monovalent hydrocarbon group or halogenated hydrocarbon group having from 1 to 10 carbon atoms, Y is a hydroxy group or an alkoxy group having from 1 to 4 carbon atoms, p is a positive number not exceeding 1 and q and r are each zero or a positive number not exceeding 3 with the proviso that p+q+r is a positive number not exceeding 4.

In particular, Japanese Patent Disclosure No. 52-113805 discloses an acryloxy-containing photocurable organopolysiloxane within the general definition of the above given average unit formula (III) but expressed by the following general formula (IV)

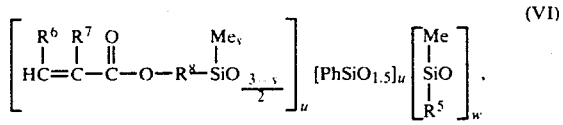

(VI)

in which $R^5$, $R^6$, $R^7$ and $R^8$ each have the same meaning as defined above, s is zero or 1 and u, v and w are each a positive integer with the proviso that w is at least 100, w/u is in the range from 35 to 2000 and w/v is in the range from 4 to 40.

The above described photocurable organopolysiloxane may be admixed, according to need, with a photosensitizer, thermal polymerization inhibitor, filler and other conventional additive agents.

The thus obtained photocurable organopolysiloxane composition is applied on to the surface of the first adhesive layer 2 on the base plate 1, if necessary, upon dilution with a suitable organic solvent followed by evaporation of the solvent to dryness. The method of coating is conventional and may be the same as in the coating of the first and the second adhesive layers 2 and 4. The thickness of the layer 3 of the photocurable organopolysiloxane composition is preferably in the range from 2 to 15 μm.

The organic solvent used for diluting the photocurable organopolysiloxane composition is exemplified by ketone solvents such as methylethylketone and methyl isobutylketone, aromatic hydrocarbon solvents such as benzene, toluene and xylene, chlorinated hydrocarbon solvents such as trichloroethylene and perchloroethylene, alcohols such as isopropyl alcohol and octyl alcohol and ester solvents such as ethyl acetate and butyl acetate.

The thus prepared base plate 1 provided with the successive layers 2 and 3 of the first adhesive agent and the photocurable organopolysiloxane composition is then laminated as is shown in FIG. 1 with the UV-transparent sheet 5 provided with the layer 4 of the second adhesive layer with an appropriate pressure and then subjected to image-wise exposure to ultraviolet light through the UV-transparent sheet 5 as is shown in FIG. 2 a or FIG. 2 b by the downward arrows 7. This image-wise exposure to light is most conveniently carried out by overlaying a negative transparency 6 having areas opaque to ultraviolet light 6' corresponding to the non-image areas in the finished printing plate as is shown in FIG. 2 a or by directly writing or drawing the images 6' with an ink opaque to ultraviolet light on the UV-transparent sheet 5 as is shown in FIG. 2 b. It is of course optional that the directly written or drawn images 6' have been provided on the sheet 5 prior to overlaying of the sheet 5 on the base plate 1.

By this image-wise irradiation with ultraviolet light, the photocurable organopolysiloxane composition in the irradiated areas is cured and adhesively bonded to the layer 4 of the second adhesive agent on the sheet 5 with a larger bonding strength than to the layer 3 of the first adhesive agent on the base plate 1. On the other hand, no adhesive bonding is developed between the layer 3 of the photocurable organopolysiloxane composition and the layer 4 of the second adhesive agent in the areas not exposed to light so that the organopolysiloxane layer 3 in these areas remains as bonded to the layer 2 of the first adhesive agent on the base plate 1.

The lamps suitable for the image-wise exposure to ultraviolet light above are exemplified by halogen lamps, metal halide lamps, xenon lamps and low-pressure, medium-pressure, high-pressure and ultrahigh-pressure mercury lamps.

The step following the image-wise exposure to light as described above is peeling of the sheet 5 off the base plate 1 as is shown in FIG. 3 a or FIG. 3 b. In this peeling, the layer of the photocured organopolysiloxane composition in the irradiated areas 3' is carried away by the sheet 5 as bonded thereto while the layer of the uncured organopolysiloxane composition 3 is left on the base plate 1 to form a pattern corresponding to the images 6' provided on the negative transparency 6 or directly written or drawn on the sheet 5.

The last step of the inventive process is the curing of the uncured organopolysiloxane composition left image-wise on the base plate 1. This step of curing is most conveniently carried out by a second irradiation with ultraviolet light 7 as is shown in FIG. 4 so that the image-wise layer of the organopolysiloxane on the base plate 1 is sufficiently photocured to give the ink-repellent non-image areas 3' on the finished printing plate. By this photocuring, the layer 3' of the organopolysiloxane composition is firmly bonded to the layer 2 of the first adhesive agent on the base plate 1 to exhibit excellent mechanical strength of the printing plate to endure long-run printing.

As is understood from the above description, a planographic printing plate with high durability and suitable for printing without the supply of dampening water is obtained by the method of the present invention involving no wet process.

Following are the examples to illustrate the method of the present invention in further detail but not to limit the scope of the invention in any way. In the examples, parts are all given by parts by weight.

EXAMPLE 1

(Experiments No. 1 to No. 4)

The base ingredient of both of the first and the second adhesive agents was a ternary copolymeric nylon composed of hexamethylenediamine adipate, hexamethylenediamine sebacate and ε-caprolactam and a master solution of the adhesive agents was prepared by dissolving 10 parts of the ternary copolymeric nylon, 1.5 parts of N,N'-methylene bisacrylamide as a photocrosslinking agent and 0.2 part of benzoin isopropyl ether as a reaction initiator in 100 parts of ethyl alcohol.

The first adhesive agents used in Experiments No. 1 to No. 4 were prepared by diluting 100 parts of the above prepared master solution of the adhesive agent with 1000 parts of ethyl alcohol with admixture of 0.1, 0.3, 0.5 or 1.0 part, respectively, of hydroquinone.

On the other hand, 100 parts of the above prepared master solution of the adhesive agent was diluted with 1000 parts of ethyl alcohol with admixture of 0.2 part of benzoin isopropyl ether to give a second adhesive agent, which was used in all of Experiments No. 1 to No. 4.

Further, a photocurable organopolysiloxane composition was prepared by dissolving 10 parts of a photocurable organopolysiloxane, 0.3 part of 4-trimethylsilyl benzophenone as a photosensitizer and 0.3 part of copper phthalocyanine blue in 200 parts of toluene. The photocurable organopolysiloxane here used was an acryloxy-containing organopolysiloxane expressed by the general formula (IV) above given, in which $R^1$ is a hydrogen atom, $R^2$ is a methyl group, $R^3$ is a propylene group, $R^4$ is a methyl group, a is zero, u is 6, v is 23 and w is 400.

The base plate used was an aluminum plate of 0.1 mm thickness and either one of the above prepared first adhesive agents was applied thereto by whirler coating to give a layer of the first adhesive agent of about 0.5 μm thickness as dried followed by drying at 80° C. for 5 minutes and then an overcoating layer was provided thereon with the photocurable organopolysiloxane composition in toluene also by whirler coating to give a layer of about 9 μm thickness as dried.

On the other hand, the second adhesive agent above prepared was applied on to a film of polyethylene terephthalate of 9 μm thickness by whirler coating to give a layer of about 1 μm thickness and, after complete drying of the coating layer, this film was laminated with the base plate under pressure in such a manner that the layer of the second adhesive agent and the layer of the photocurable organopolysiloxane composition were in direct contact with each other.

The thus obtained laminate was further contacted directly with a negative transparency on the polyethylene terephthalate film and irradiated with ultraviolet light at a wavelength of 365 nm and having a power density of 60 watts/m² for 20 seconds through the negative transparency to effect image-wise photocuring of the organopolysiloxane composition. Thereupon, the polyethylene terephthalate film was separated apart from the base plate by peeling to find that the layer of the organopolysiloxane composition in the irradiated areas was carried away by the polyethylene terephthalate film while the organopolysiloxane layer in the unirradiated areas was left on the base plate to form an image-wise pattern.

The base plate thus obtained bearing the image-wise layer of the uncured organopolysiloxane composition was then subjected to a second irradiation with ultraviolet light with the same conditions as above with the irradiation time of 20 minutes so that the organopolysiloxane composition was photocured and, in the same time, bonded firmly to the underlying layer of the first adhesive agent.

The printing plate above prepared was mounted on an A. B. Dick printing press and planographic printing test was carried out without dampening water. The number of the printed sheets with clear and sharp image pattern was recorded for each of the experiments along with the quality of the images obtained by peeling of the sheet. The results are set out in Table 1 below.

TABLE 1

| Experiment No. | Hydroquinone added, parts | Quality of images by peeling | Durability in printing |
| --- | --- | --- | --- |
| 1 | 0.1 | poor | — |
| 2 | 0.3 | good | excellent (30,000 sheets) |
| 3 | 0.5 | excellent | excellent (30,000 sheets) |
| 4 | 1.0 | excellent | good (20,000 sheets) |

EXAMPLE 2

(Experiments No. 5 to No. 7)

A master solution of the adhesive agent was prepared by dissolving 10 parts of a binary copolymeric polyamide resin composed of 4,4'-diammoniumdicyclohexylmethane adipate and ε-caprolactam, 0.3 part of triethyleneglycol diacrylate, 0.3 part of 1,3-xylene bisacrylamide and 0.3 part of N-methylolacrylamide as the photocuring agents and 0.1 part of benzoin isopropyl ether as the reaction initiator in 100 parts of a 2:1 mixture of methyl alcohol and ethyl alcohol.

Three kinds of adhesive agents were prepared for use as the first adhesive agent to be applied on a base plate by diluting each 100 parts of the above prepared master solution with 1000 parts of ethyl alcohol with admixture of 0.5 part each of tert-butylcatechol, tert-butylpyrogallol or 2,2'-methylene-bis(4-ethyl-6-tert-butylphenol) for Experiments No. 5, No. 6 and No. 7, respectively, as the desensitizing agent.

Planographic printing plates were prepared in the same manner as in Example 1 by use of either one of the above prepared adhesive agents for coating the base plate as the layer of the first adhesive agent. The photocurable organopolysiloxane composition and the second adhesive agent for coating the polyethylene terephthalate film were the same ones as in Example 1. The results of the tests for the durability of the plates in printing as well as the quality of the images by peeling are set out in Table 2 below.

TABLE 2

| Experiment No. | Desensitizing agent | Quality of images by peeling | Durability in printing |
|---|---|---|---|
| 5 | tert-butyl catechol | excellent | good (20,000 sheets) |
| 6 | tert-butyl pyrogallol | excellent | good (15,000 sheets) |
| 7 | 2,2'-methylene-bis-(4-ethyl-6-tert-butylphenol) | excellent | excellent (30,000 sheets) |

EXAMPLE 3

(Experiments No. 8 to No. 11)

The experimental procedure for Experiments No. 8 to No. 10 was the same as in Example 1 except that the first adhesive agent applied on to the base plate was prepared by diluting 100 parts of the same master solution with 1000 parts of ethyl alcohol with admixture of 0.5 part of one of three novolac type phenol resins supplied by three different producers in place of hydroquinone in Example 1.

The thus prepared printing plates had good storability and excellent durability in printing giving about 35,000 sheets of sharp printed materials. For comparison, the same experimental procedure was repeated (Experiment No. 11) except that the phenol resin was omitted, i.e. the first adhesive agent applied on to the base plate was prepared by merely diluting the master solution with 10 times by weight of ethyl alcohol. In this case, no image-wise pattern was formed by peeling of the sheet off the base plate so that no printed material was obtained.

What is claimed is:

1. A method for the preparation of a planographic printing plate suitable for printing without supply of dampening water which comprises the steps of
   (a) laminating a base plate provided on one surface thereof with successive layers of a first adhesive agent and a photocurable organopolysiloxane composition, the adhesive bonding strength of the first adhesive agent to the organopolysiloxane composition being increased with the exposure dose to light, and a sheet which is transparent to ultraviolet light and provided on one surface thereof with a layer of a second adhesive agent in such a manner that the layer of the photocurable organopolysiloxane composition and the layer of the second adhesive agent are in direct contact with each other, the adhesive bonding strength of the second adhesive agent to the photocurable organopolysiloxane composition being increased with the exposure dose to light and the second adhesive agent being imparted with a stronger adhesive bonding strength to the photocurable organopolysiloxane composition than the first adhesive agent with the exposure dose to light being the same,
   (b) subjecting the laminate obtained in the step (a) to image-wise exposure to light through an image pattern opaque to ultraviolet light provided on said sheet,
   (c) separating said sheet apart from said base plate by peeling so as that the layer of the organopolysiloxane composition photocured in the areas exposed to light is carried by the sheet and the layer of the uncured organopolysiloxane composition in the unexposed areas is left on the base plate, and
   (d) subjecting the base plate bearing the layer of the uncured organopolysiloxane composition to exposure to light to effect photocuring of the organopolysiloxane composition.

2. The method as claimed in claim 1 wherein the first and the second adhesive agents are prepared by admixing a photocurable resin with 1.0 to 40% by weight of a photodesensitizing agent or with 0.5 to 6.0% by weight of a photosensitizer, respectively.

3. The method as claimed in claim 1 wherein the photocurable organopolysiloxane composition is a substituted maleimido-containing organopolysiloxane admixed with a photosensitizer.

4. The method as claimed in claim 1 wherein the photocurable organopolysiloxane composition is an acryloxy-containing organopolysiloxane admixed with a photosensitizer.

* * * * *